US010062757B2

(12) United States Patent
Toia et al.

(10) Patent No.: US 10,062,757 B2
(45) Date of Patent: Aug. 28, 2018

(54) SEMICONDUCTOR DEVICE WITH BURIED METALLIC REGION, AND METHOD FOR MANUFACTURING THE SEMICONDUCTOR DEVICE

(71) Applicant: STMICROELECTRONICS S.R.L., Agrate Brianza (IT)

(72) Inventors: Fabrizio Fausto Renzo Toia, Busto Arsizio (IT); Claudio Contiero, Buccinasco (IT); Elisabetta Pizzi, Limbiate (IT); Simone Dario Mariani, Vedano al Lambro (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/250,638

(22) Filed: Aug. 29, 2016

(65) Prior Publication Data
US 2017/0250253 A1  Aug. 31, 2017

(30) Foreign Application Priority Data

Feb. 25, 2016 (IT) .................. 102016000019688

(51) Int. Cl.
*H01L 23/58* (2006.01)
*H01L 29/10* (2006.01)
(Continued)

(52) U.S. Cl.
CPC ...... *H01L 29/1087* (2013.01); *H01L 21/0265* (2013.01); *H01L 21/02381* (2013.01); *H01L 21/02532* (2013.01); *H01L 21/02639* (2013.01); *H01L 21/02664* (2013.01); *H01L 21/3247* (2013.01); *H01L 21/74* (2013.01); *H01L 21/743* (2013.01); *H01L 23/535* (2013.01); *H01L 29/1083* (2013.01); *H01L 29/401* (2013.01); *H01L 29/7802* (2013.01)

(58) Field of Classification Search
CPC ............ H01L 29/1087; H01L 29/7802; H01L 29/1083; H01L 29/401
See application file for complete search history.

(56) References Cited

U.S. PATENT DOCUMENTS 7,456,071 B2  11/2008 Marty et al.
8,173,513 B2   5/2012 Villa et al.
(Continued)

OTHER PUBLICATIONS

Goh et al., "Electrical Characterization of Dielectrically Isolated Silicon Substrates Containing Buried Metallic Layers," *IEEE Electron Device Letters* 18(5): 232-234, 1997.
(Continued)

*Primary Examiner* — Stephen W Smoot
*Assistant Examiner* — Vicki B Booker
(74) *Attorney, Agent, or Firm* — Seed IP Law Group LLP

(57) ABSTRACT

A semiconductor device includes: a semiconductor body including an active region that houses an electronic component and a passive dielectric region surrounding the active region; a conductive buried region, of metallic material or metallic alloy, which extends in the semiconductor body in the active region; and one or more electrical contacts, of metallic material, which extend between the conductive buried region and a top surface of the semiconductor body, and form respective paths for electrical access to the conductive buried region.

14 Claims, 6 Drawing Sheets

(51) Int. Cl.
*H01L 29/78* (2006.01)
*H01L 29/40* (2006.01)
*H01L 21/02* (2006.01)
*H01L 21/324* (2006.01)
*H01L 23/535* (2006.01)
*H01L 21/74* (2006.01)

(56) References Cited

U.S. PATENT DOCUMENTS

| | | |
|---|---|---|
| 2002/0076896 A1 | 6/2002 | Farrar et al. |
| 2003/0102576 A1 | 6/2003 | Teramoto |
| 2004/0248349 A1 | 12/2004 | Renna et al. |
| 2005/0258424 A1 | 11/2005 | Sautreuil et al. |
| 2011/0084356 A1 | 4/2011 | Saarnilehto et al. |
| 2011/0101452 A1 | 5/2011 | Sonsky et al. |
| 2011/0133186 A1 | 6/2011 | Barlocchi et al. |
| 2012/0098142 A1 | 4/2012 | Croce et al. |
| 2014/0021546 A1* | 1/2014 | Onoda ................ H01L 29/7833 257/344 |

OTHER PUBLICATIONS

Sato et al., "Fabrication of Silicon-on-Nothing Structure by Substrate Engineering Using the Empty-Space-in-Silicon Formation Technique," *Japanese Journal of Applied Physics* 43(1): 12-18, 2004.

* cited by examiner

SEMICONDUCTOR DEVICE WITH BURIED METALLIC REGION, AND METHOD FOR MANUFACTURING THE SEMICONDUCTOR DEVICE

BACKGROUND

Technical Field

The present disclosure relates to a semiconductor device with a buried conductive region, in particular a buried metallic region, and to a method for manufacturing the semiconductor device.

Description of the Related Art

In the field of semiconductor devices, deep doped layers (also known as "deep buried layers") provided in the semiconductor substrate are frequently used. For instance, in bipolar transistors, vertical-diffusion DMOS (VDMOS) transistors, and trench-MOS transistors, heavily doped deep buried layers are used for improving the properties of the system. The deep buried layer provides in fact a low-resistance contact that extends underneath the device. In this way, for example, it is possible to reduce the resistance of the collector, in the case of a bipolar transistor, or the drain resistance in the case of a DMOS or VDMOS transistor for guarantying high speeds of response and low power consumption. The electrical contact with the deep buried layers is generally obtained by providing the so-called "sinkers". A sinker is obtained by implantation of high-energy ions in the surface of the substrate and subsequent diffusion, for example by annealing at high temperature, of said ions in the substrate for a time sufficient for them to reach the deep buried layer that is to be contacted electrically. Other methods for producing electrical contacts with deep buried layers include etching the semiconductor substrate until the deep buried layers are reached and depositing metallic material within the trenches thus formed.

There is felt in the state of the art the need to replace the deep buried layers with metallic layers, which afford a wide range of advantages. A metallic layer is certainly more conductive than any implanted layer, even one having a high concentration of dopant species, and could thus replace the buried doped collector in bipolar transistors, with a reduction of the collector resistance. Likewise, in the case of VDMOS transistors the buried conductive region provides a highly conductive drain region.

Applications of devices including a buried metallic layer are multiple, and include optoelectronics, millimetric-wave components and circuits, and above all, integrated circuits for applications of a smart-power type, in particular for the automotive industry, in the industrial sectors in general, and in the industrial compartment of consumer goods.

Known techniques for providing buried metallic layers envisage coupling, via bonding, of previously machined semiconductor substrates. In particular, one of these substrates has a layer of metal (or a precursor of a metal) deposited by sputtering on a surface of the substrate, and the bonding base has the function of "burying" said layer. See, for example the scientific publication by W. L. Goh, et al., "Electrical Characterization of Dielectrically Isolated Silicon Substrates Containing Buried Metal Layers", IEEE Electron Device Letters, vol. 18, No. 5, May 1997.

The known art presents, however, the disadvantage of requiring a step of coupling via bonding that proves costly, does not enable development of monolithic devices, and in general sets limitations on the metallic materials that may be used for the buried layer.

BRIEF SUMMARY

At least some embodiments of the present disclosure provide a semiconductor device with a buried conductive region, in particular a buried metallic region, and a method for manufacturing the semiconductor device that will be able to overcome the drawbacks of the known art.

According to the present disclosure a semiconductor device includes:

a semiconductor body including an active region that houses an electronic component and a dielectric passive region surrounding the active region;

a metallic buried region which extends in the semiconductor body adjacent to said active region; and a metallic contact extends between the conductive buried region and a top surface of the semiconductor body and forms a path for electrical access to the conductive buried region.

BRIEF DESCRIPTION OF THE SEVERAL VIEWS OF THE DRAWINGS

For a better understanding of the disclosure, some embodiments thereof will now be described, purely by way of non-limiting example and with reference to the attached drawings, wherein.

DETAILED DESCRIPTION

Figure 1:
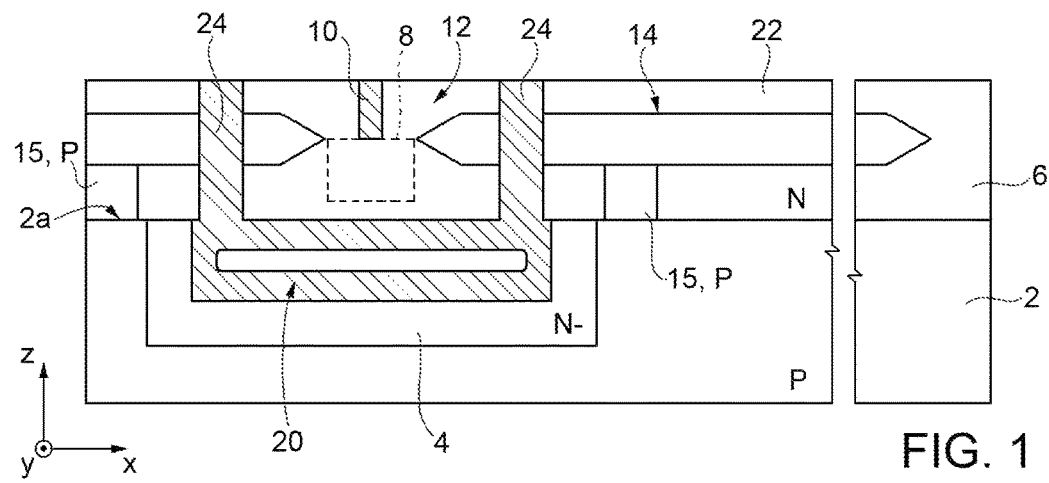
FIG. 1 shows, in lateral sectional view, a semiconductor device provided with a buried metallic region according to one aspect of the present disclosure.

FIG. 1 is a schematic lateral sectional view, in a reference system of axes X, Y, Z, of a portion of an integrated semiconductor device 1, according to one aspect of the present disclosure. The integrated semiconductor device 1 comprises a semiconductor substrate 2, for example of silicon, having a first conductivity (e.g., of a P type), extending in which is an implanted region 4 having a second conductivity (e.g., of an N type). The semiconductor substrate 2 is doped with dopant species of a P type (e.g., boron) with a concentration comprised between $10^{14}$ and $10^{16}$ atoms/cm$^3$, whereas the implanted region 4 is doped with dopant species of an N type (e.g., arsenic) with a concentration comprised between $10^{15}$ and $10^{18}$ atoms/cm$^3$.

The semiconductor substrate 2 has a thickness, along Z, for example comprised between 10 µm and 700 µm, and the implanted region 4 extends in the substrate 2 along Z, starting from a top surface 2a of the substrate 2, for a depth comprised between 3 µm and 10 µm.

Extending on the top surface 2a of the semiconductor substrate 2 is an epitaxial layer 6 of semiconductor material, for example silicon, having the second conductivity (N). The epitaxial layer 6 houses at least in part, in a per se known manner and not illustrated in detail in FIG. 1, parts of an electronic component 8, such as for example a vertical-diffusion DMOS (VDMOS) transistor, or a trench-MOS transistor, or a bipolar transistor. For instance, in the case of a DMOS transistor, it comprises in particular a gate region, a source region, and a drain region. Electrical connectors 10

(just one of which is illustrated in the figure) form respective electrical paths for the source and drain regions, and for gate biasing. The region that houses the electronic component 8 is an active region 12 of the integrated semiconductor device 1, in which there occur phenomena of transport and conduction of electrical charge.

Extending alongside the active region 12 is an insulation region 14, for example of silicon oxide, which forms a region known as "field oxide" (FOX) region. The insulation region 14 has, for example, a thickness, along Z, comprised between 0.2 µm and 1 µm. The insulation region 14 is also referred to as "passive region" in so far as, unlike the active region 12, no electrical-conduction channels of the electronic component 8 are set up therein.

The integrated semiconductor device 1 further comprises a buried conductive region 20 adjacent to the active region 12, of metallic material (such as a single metal or an alloy), for example including tungsten, aluminum, or copper. According to the embodiment illustrated in FIG. 1, the buried conductive region 20 extends in the semiconductor substrate 2 starting from the interface between the implanted region 4 and the epitaxial layer 6. In particular, the buried conductive region 20 is surrounded by the implanted region 4, with a doping of an N type, and is not in direct electrical contact with the regions of the substrate 2 having a doping of a P type. In this way, formation of a Schottky diode between the buried conductive region 20 and the substrate 2 is prevented.

According to a different embodiment (not illustrated in the figure), the buried conductive region 20 extends completely in the epitaxial layer 6 and is separated from the substrate 2 by a portion of the epitaxial layer 6. In this case, the implanted region 4 is not necessary.

According to a further embodiment (not illustrated in the figure), the buried conductive region 20 extends in part in the implanted region 4 of the semiconductor substrate 2 and in part in the epitaxial layer 6.

According to one aspect of the present disclosure, the buried conductive region 20 is a partially hollow region, the walls of which are completely covered by a metallic layer.

According to a different embodiment, the buried conductive region 20 does not have hollow portions, but is uniformly filled by metallic material.

The presence or otherwise of cavities in the buried conductive region 20 depends upon the filling method used and does not modify operation of the integrated semiconductor device 1.

The integrated semiconductor device 1 further comprises a pre-metal dielectric (PMD) layer 22, i.e., a layer of dielectric material that separates the epitaxial layer 6 (and the electronic component 8 obtained therein) from the first metallic layer provided on the front of the integrated semiconductor device 1 and having the function of creating electrical connections (for example, for routing, or for providing connections between integrated electronic devices, at a distance and isolated from one another, in one the same epitaxial layer 6). The pre-metal dielectric layer 22 may, for example, be made of silicon oxide. The pre-metal dielectric layer 22 may have a thickness chosen as desired, for example comprised between 0.5 µm and 1 µm.

The buried conductive region 20 is connected to the top surface of the integrated semiconductor device 1 by one or more vertical electrical contacts 24, e.g., ones having their main extension along Z. The electrical contacts 24 are obtained in trenches that extend from the buried conductive region 20, through the epitaxial layer 6, the insulation region 14, and the pre-metal dielectric layer 22. The electrical contacts 24 are made of metallic material, in particular of the same material as the one used for formation of the buried conductive region 20.

Figure 10:
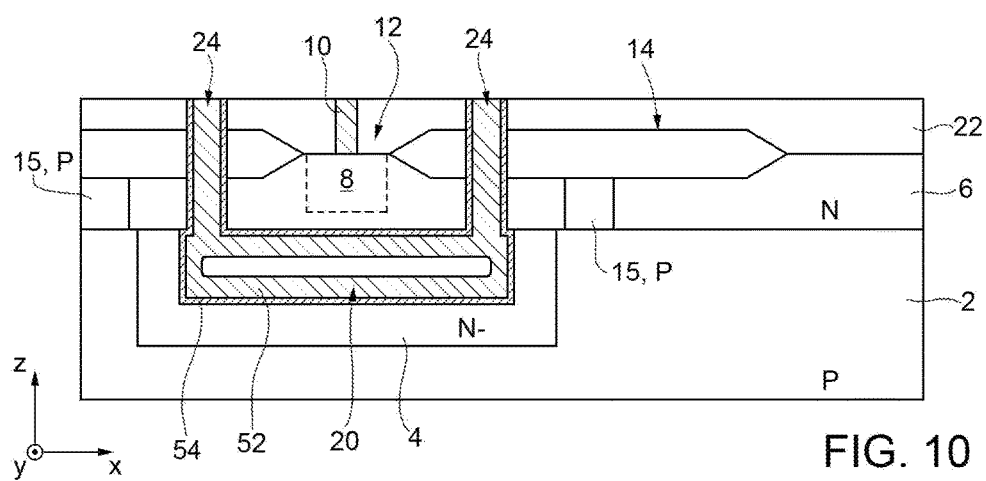
Figure 11:
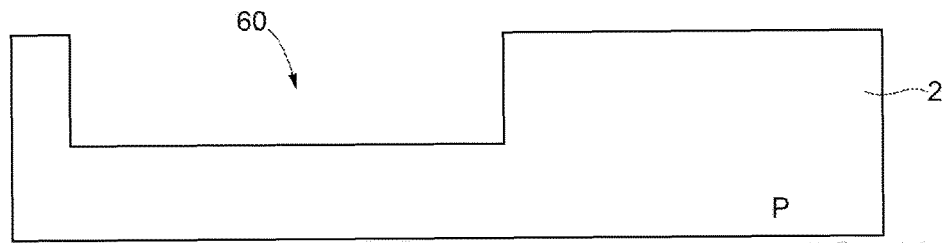
FIGS. 11-16 show, in lateral sectional view, steps for manufacturing the semiconductor device of FIG. 1, according to an embodiment of the present disclosure alternative to that of FIGS. 2-10.
Figure 12:
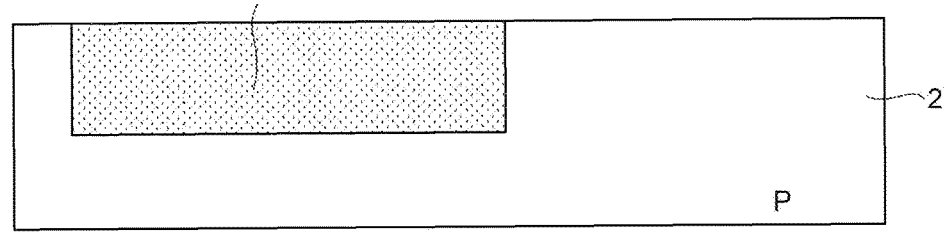
Figure 13:
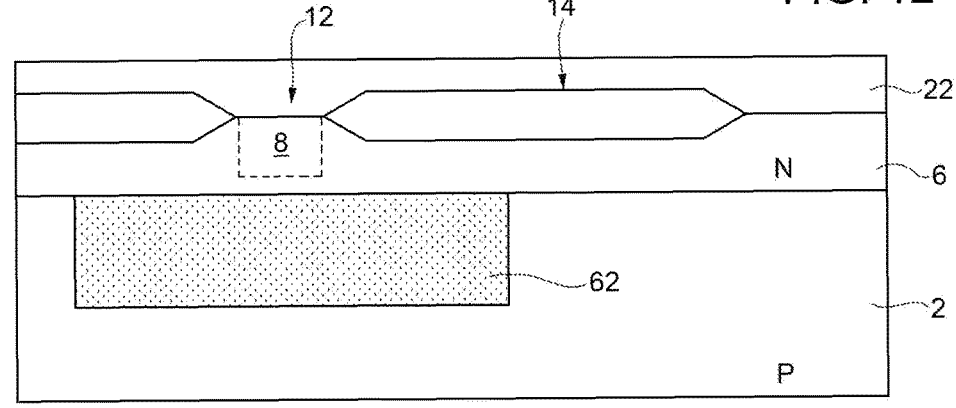
Figure 14:
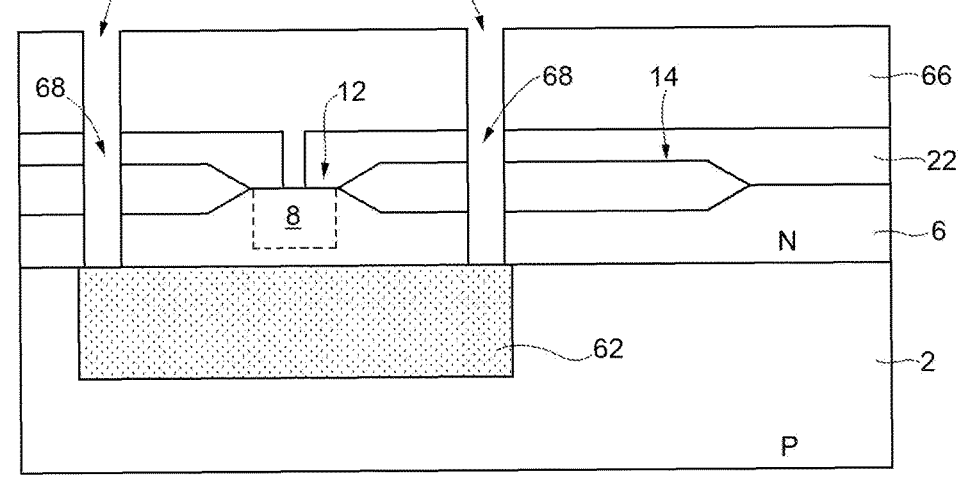
Figure 15:
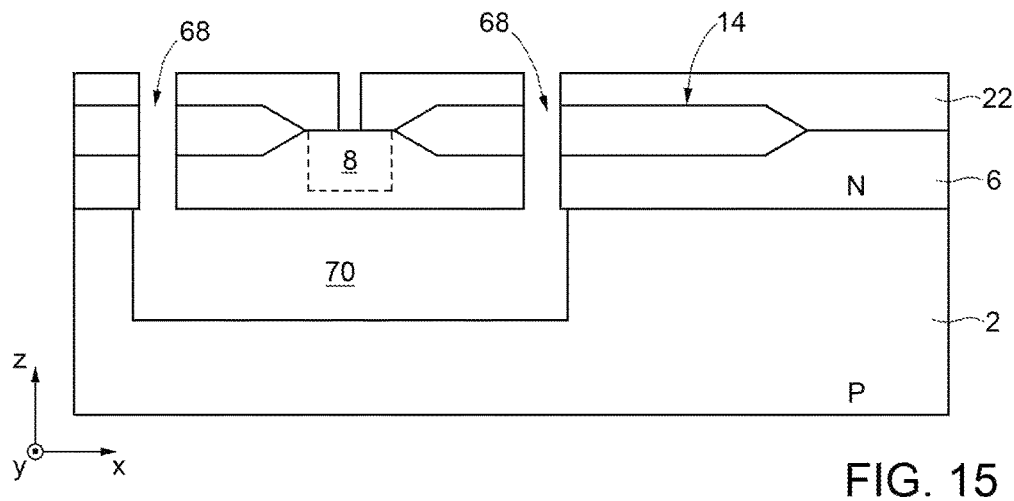
Figure 16:
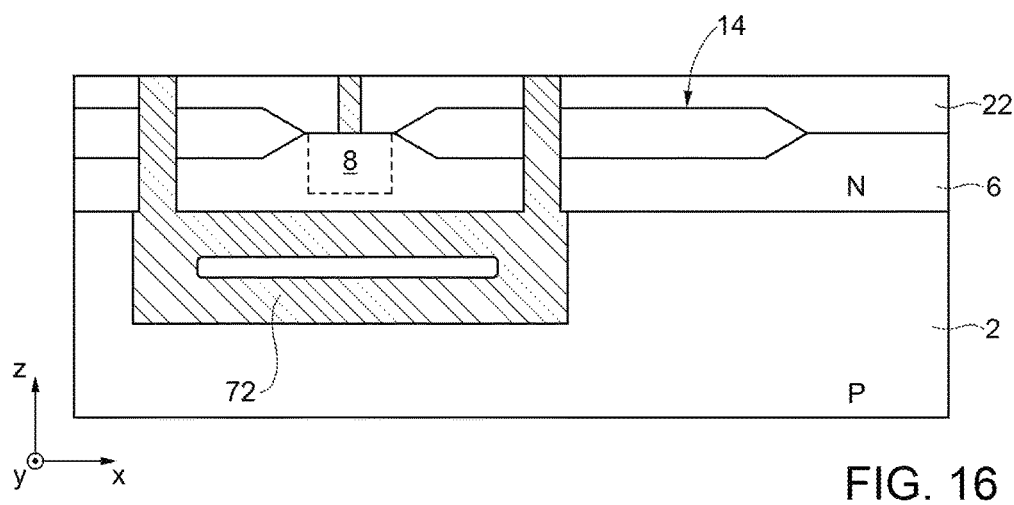

In order to prevent any possible undesirable contamination of the epitaxial layer 6 and of the substrate 2 by the metallic filling material of the electrical contacts 24 and of the metallic material that forms the buried conductive region 20, it is advisable to envisage, prior to the step of formation of the metallic material, a step of formation of a barrier layer (not illustrated in detail in FIG. 1) designed to prevent diffusion of metal ions within the epitaxial layer 6 and the substrate 2. Formation of said barrier layer is more fully illustrated hereinafter, with reference to FIG. 10.

FIGS. 2-10 show, in a same lateral sectional view of FIG. 1, steps for manufacture of the integrated semiconductor device 1.

Figure 2:
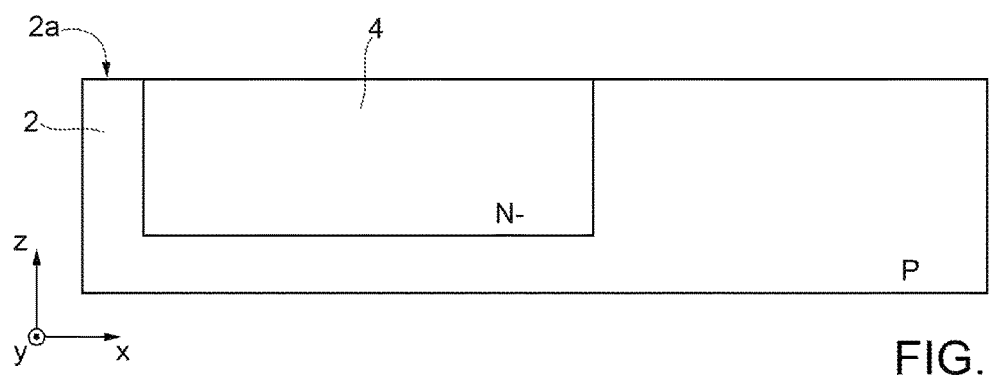
FIGS. 2-10 show, in lateral sectional view, steps for manufacturing the semiconductor device of FIG. 1 according to an embodiment of the present disclosure.

With reference to FIG. 2, the semiconductor substrate 2, for example of silicon with a doping of a P type, is provided as described previously.

This is followed by a step of masked implantation of dopant species (e.g., arsenic or phosphorus), and a subsequent diffusion step (by thermal annealing) to create the implanted region 4.

Then (FIGS. 3A-5), there follow steps of formation of a buried cavity (designated by the reference number 40 in FIG. 6), which extends in the implanted region 4 and which, in subsequent machining steps, concurs to form the buried conductive region 20.

For this purpose (FIG. 3A), an etching mask 30, made, for example, of silicon oxide, is formed on the surface 2a of the substrate 2. Alternatively, the mask may be a photolithographic or photoresist mask. The mask 30 is defined so as to provide a plurality of openings 30' in the implanted region 4 and, more in particular, in the portion of the implanted region 4 in which the buried cavity is to be formed.

Figure 3A:
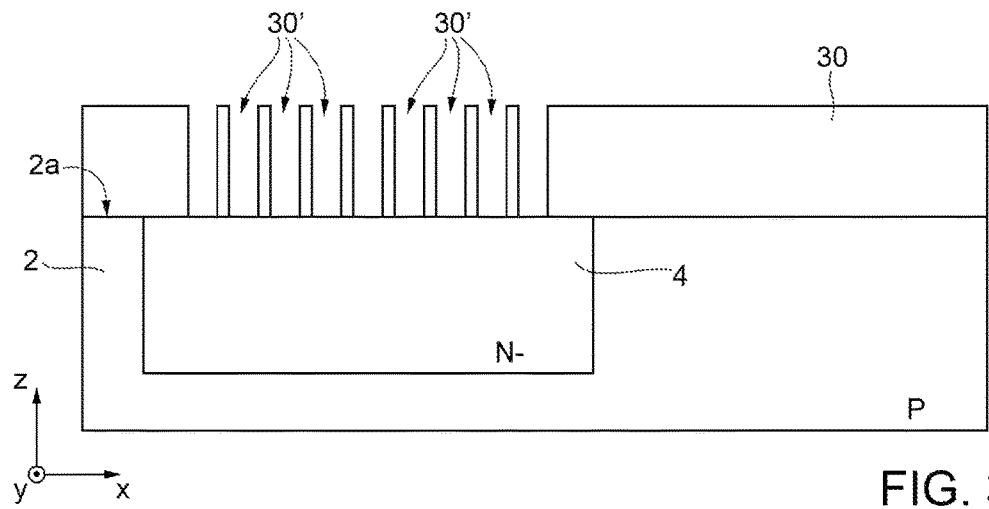
Figure 3B:
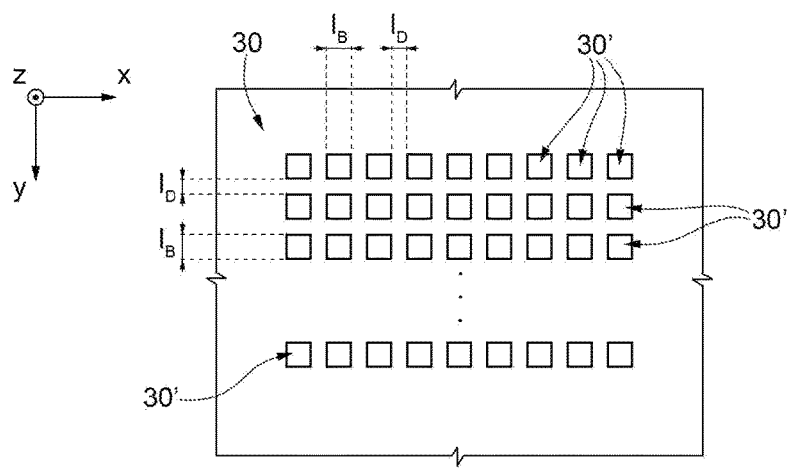

FIG. 3B shows, in top plan view in the plane XY, the portion of the photolithographic mask 30, including the openings 30'. In this example, the openings 30' have a quadrangular shape, for instance square with side $l_B$ comprised between 0.5 µm and 3 µm, and form an array of openings in which each opening 30' is arranged, from an immediately adjacent opening, at a distance $l_D$ comprised between 0.5 µm and 3 µm.

It is, however, evident that the openings 30' may have a shape and/or spatial arrangement different from the one illustrated in FIG. 3B (for example, they may have a circular or generically polygonal shape).

Then (FIG. 4), an etching step is carried out, for example a step of dry etching (RIE), to remove selective portions of the substrate 2 exposed through the openings 30' of the mask 30. During etching, portions of the implanted region 4 are removed, and etching proceeds until a desired depth is reached in the implanted region 4, for example a depth, measured along Z starting from the surface 2a of the substrate, comprised between 0.5 µm and 5 µm.

Then, the etching mask 30 is removed. Trenches 32 are thus formed in the substrate 2.

In one embodiment, each trench 32 is shaped, in top plan view in the plane XY, like a square with side a having a value, substantially defined by the openings 30' of the etching mask 30, comprised between 0.5 µm and 3 µm, and a depth b, measured along Z starting from the surface 2a of the substrate 2, having a value comprised between 0.5 µm and 5 µm. Each trench 32 is separated from an adjacent trench 32, along X, by walls or columns 34 of thickness c defined substantially by the value chosen for the distance $l_D$ of the mask 30, i.e., between 0.5 µm and 3 µm.

Figure 4:
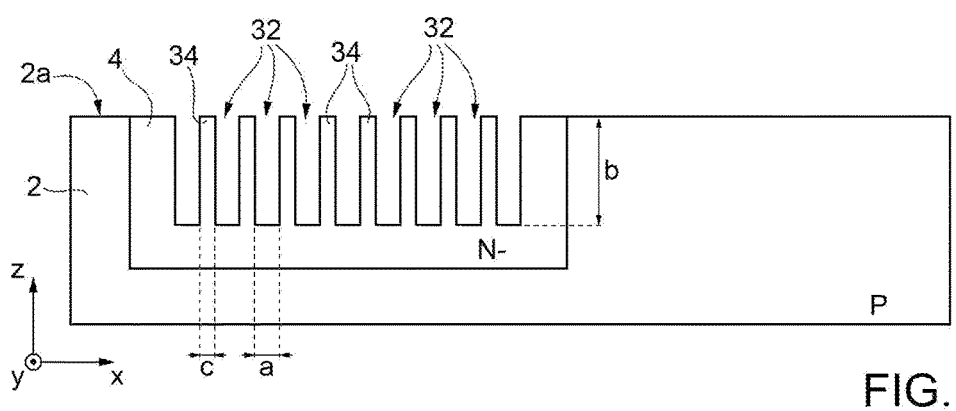
Figure 5:
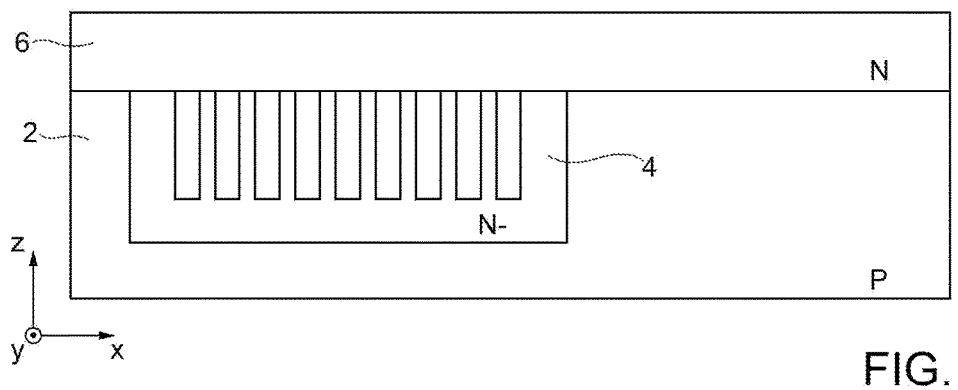

According to what has been described with reference to FIGS. 3A-4, the trenches 32, which, in subsequent steps, concur in formation of a buried cavity, are obtained exclusively in the substrate 2. In this case, also the buried cavity 40 will be formed substantially in the substrate 2, in particular within the implanted region 4. In the case where it were desired to form the buried cavity at a depth, along Z, greater than the thickness of the substrate 2, it is possible to carry out, prior to the step of FIG. 3A, a first epitaxial growth of the epitaxial layer 6 (in a way not illustrated in the figure). This is followed by the steps of formation of the trenches 32 in a way similar to what has been described previously. One or more further epitaxial growths for completing formation of an epitaxial layer 6 of desired thickness may be carried out following upon formation of the buried cavity 40.

Formation of a buried cavity 40 is carried out in a per se known manner, for example according to the method for formation of buried cavities described in U.S. Pat. No. 8,173,513. In this case (FIG. 5), an epitaxial growth is carried out in a deoxidizing environment, typically, in an atmosphere presenting a high concentration of hydrogen, preferably using trichlorosilane ($SiHCl_3$). Consequently, an epitaxial layer 6, here of an N type, grows on top of the silicon columns 34 and closes the trenches 32 at the top, trapping in the trenches 32 the gas present in the reactor used for epitaxial growth (here, hydrogen molecules). The thickness of the epitaxial layer 6 is of some microns, for example between 3 μm and 10 μm.

An annealing step, for example for 30 min at 1190° C., is then carried out. The annealing step causes (FIG. 6) in a per se known manner, migration of the silicon atoms, which tend to move into the position of minimum energy. Consequently, at the trenches 32, where the silicon columns 34 are arranged close together, the silicon atoms migrate completely and form a buried cavity 40, closed at the top by the epitaxial layer 6. Preferably, the previous annealing step is carried out in a hydrogen atmosphere so as to prevent the hydrogen present in the trenches 32 from escaping through the epitaxial layer 6 towards the outside and so as to increase the concentration of hydrogen present in the buried cavity 40 in the case where the amount trapped during the step of epitaxial growth were insufficient. Alternatively, annealing may be carried out in a nitrogen environment.

Formation of a buried cavity 40 may likewise be carried out according to other processes of a known type. For instance, the scientific publication by Tsutomu Sato, et al., "Fabrication of Silicon-on-Nothing Structure by Substrate Engineering Using the Empty-Space-in-Silicon Formation Technique", Japanese Journal of Applied Physics, Vol. 43, No. 1, 2004, pp. 12-18, describes a method of formation of buried cavities that envisages, after the step of FIG. 4, an annealing step in a deoxidizing environment, for example in hydrogen, which causes surface migration of the atoms that tends to close the trenches 32 at the surface 2a of the substrate 2 and to arrange the trenches 32 in communication with one another underneath the surface 2a, thus forming a buried cavity. Annealing is carried out at a temperature comprised between 1100° C. and 1150° C., at a pressure of 10 Torr, and for a time of 10 min. In general, the thermal treatment may be carried out at temperatures comprised between 1050° C. and 1250° C., at a pressure comprised between 5 and 50 Torr, and for a time of 5-20 min.

The method described in the aforementioned scientific publication by Tsutomu Sato, et al., further specifies some parameters useful for setting the depth at which the buried cavity is formed. In particular, once the values of the side a of each trench 32 (assumed as being square), and of the depth b of each trench 32 are known, the minimum depth at which the buried cavity 40 is formed (i.e., the depth at which the buried cavity 40 is reached starting from the surface 2a) is given by 0.3a+0.56b. Further, the thickness t, along Z, of the buried cavity 40 is given by t=1.4a+0.11b. The volume of the buried cavity 40 is given by $V_s=4\pi/3 \cdot (t/2)^3$.

Also the thickness c of the walls or columns 34 plays an important rule in design of the cavity. It emerges in fact that the value of depth d at which formation of the buried cavity 40 is obtained is greater than a+c.

Figure 6:
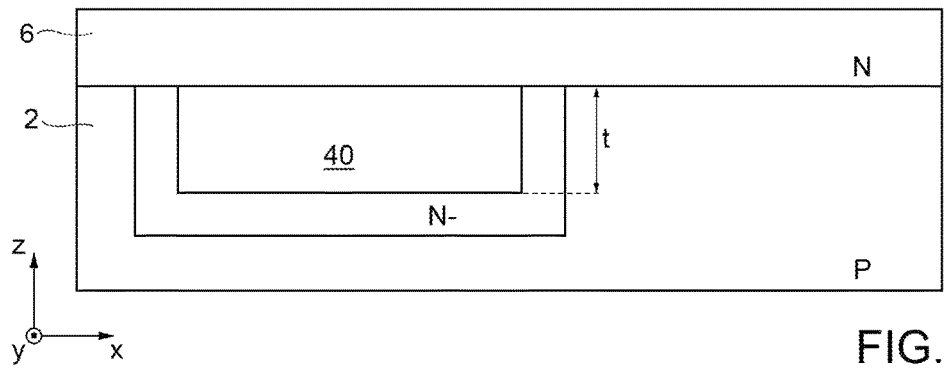

An epitaxial growth of an silicon layer with N doping on the substrate 2 is then carried out to form the epitaxial layer 6 and obtain a wafer similar to the one illustrated in FIG. 6.

Figure 7:
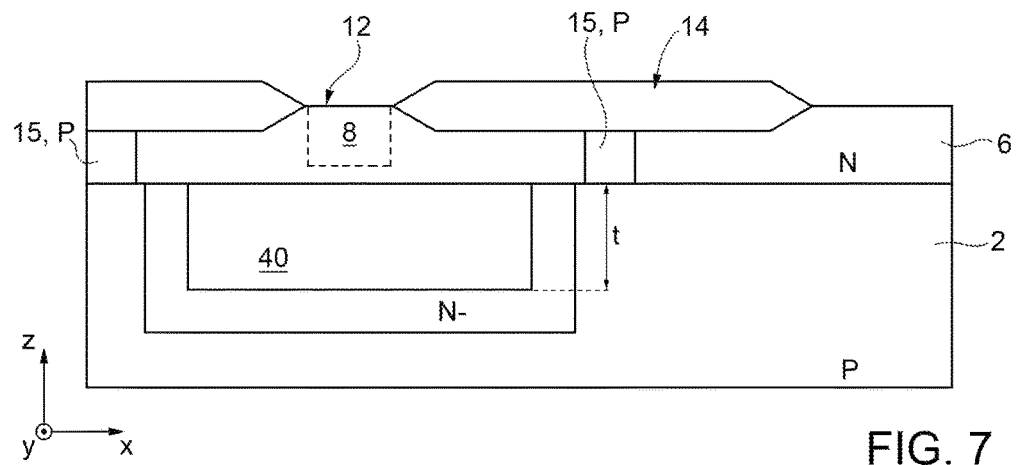
Figure 8:
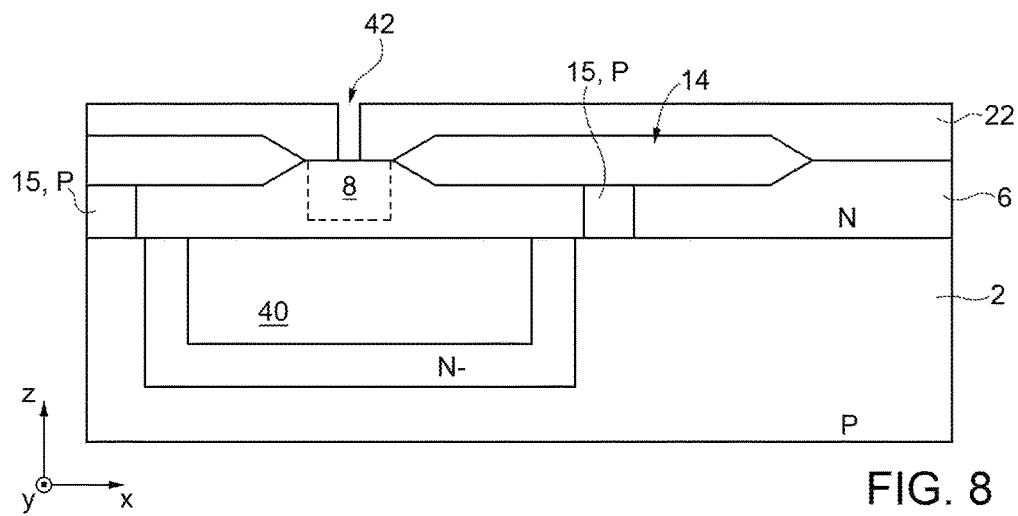

Irrespective of the embodiment chosen for formation of the buried cavity 40, there then follow, as illustrated in FIG. 7, known processing steps of formation of the electronic component 8 integrated in the epitaxial layer 6. The electronic component 8 is fabricated in portions of the epitaxial layer 6 that extend over the buried cavity 40. These steps do not form the subject of the present disclosure and belong to the known art. They are consequently not described in detail herein.

Further, once again with reference to FIG. 7, the insulation region 14 (field oxide) is formed alongside the electronic component 8, as well as one or more electrical-insulation regions 15, which extend between the insulation region 14 and the substrate 2 alongside the region in which the electrical contacts 24 will subsequently be provided (step of FIGS. 9 and 10) and which surround the electronic component 8 completely (to form, for example, in top plan view in the plane XY, a ring-shaped insulating path). The electrical-insulation regions 15 provide for electrical insulation of the electronic component 8, and the corresponding electrical contacts 24 from further electronic components (not illustrated) integrated in the same wafer or chip. The electrical-insulation regions 15 may be obtained by implantation in the epitaxial layer 6 of dopant species of a P type, or else by forming insulating trenches (for example, filled with silicon oxide) throughout the thickness of the epitaxial layer 6.

Then (FIG. 8), the pre-metal dielectric layer (PMD) 22 is formed, for example by depositing silicon oxide. The pre-metal dielectric layer 22 is selectively removed, by known lithographic and etching steps, to form one or more trenches 42 (just one of which is shown in the figure) for electrical contact of specific portions of the electronic component 8.

There then follows (FIG. 9) a step of formation and photolithographic definition of an etching mask 44, having openings 44' in regions in which it is desired to form trenches 48 that connect the buried cavity 40 with the surface of the pre-metal dielectric layer 22. The openings 44' are, in particular, aligned, along Z, to peripheral portions of the cavity 40. The etching mask 44 also penetrates within the trench//trenches 42 to protect the latter during the subsequent manufacturing steps.

The openings 44' of the etching mask 44 extend, in the view in the plane XY, along part of the perimeter of the cavity 40, and in any case to not jeopardize the structural stability of the area of the wafer that houses the electronic component 8. In the view in the plane XZ, the openings 44' extend, along Z, above the cavity 40. For instance, the openings 44' have a shape, in the plane XY, that is quadrangular with sides comprised between 1 μm and 2 μm.

Further, according to a different aspect of the present disclosure, the size of the openings 44' may be selected so that the aspect ratio of the trenches 48 (i.e., the ratio between the depth of the trenches 48 and their respective width) is equal to or greater than 2, for example between 2 and 6.

A step of wet or dry etching of the wafer is then carried out (as represented schematically, in FIG. 9, by the arrows 49) to remove selectively exposed portions of the pre-metal dielectric layer 22, of the insulation region 14, and of the epitaxial layer 6, until the buried cavity 40 is reached, thus forming the trenches 48. Since the materials of which the pre-metal dielectric layer 22, the insulation region 14, and the epitaxial layer 6 are formed may be different from one another, etching steps are carried out in succession, selecting suitable etching chemistries. For instance, the pre-metal dielectric layer 22 and the insulation region 14 may be removed by a fluorine/oxygen-based etching chemistry, and the epitaxial layer 6 by an etching chemistry with a base of sulphur hexafluoride ($SF_6$) and octafluorocyclobutane ($C_4F_8$). Other etching chemistries may be used. The depth of the trenches 48 is such that the buried cavity 40 is reached.

The etching mask 44 may then be removed from the wafer and from within the trench/trenches 42.

Next (FIG. 10), a step of, at least partial, filling of the buried cavity 40 with metallic material or a metallic alloy is carried out.

Figure 9:
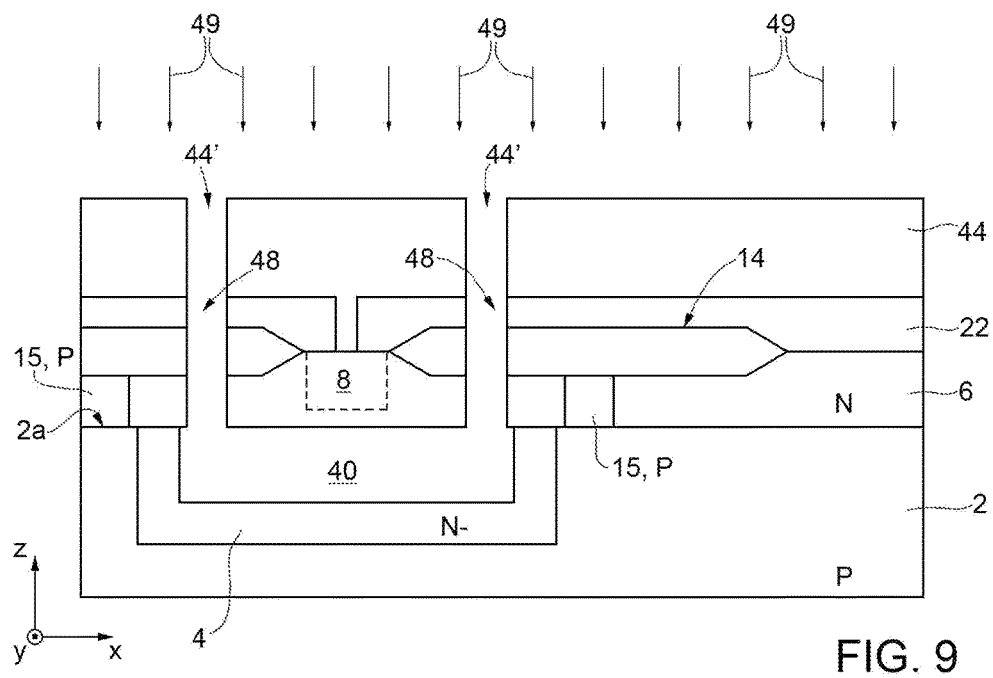

For this purpose, according to one aspect of the present disclosure, the wafer of FIG. 9 is arranged in a CVD reactor, and a step of deposition of metallic material, such as for example tungsten (W) or titanium (Ti) or copper (Cu), is carried out. By adjusting the deposition parameters, in particular by selecting an operating pressure of some tens or hundreds of millitorr (in any case below atmospheric pressure), and a temperature comprised between 200° C. and 400° C., the present applicant has found that the metallic material penetrates into the trenches 48 and deposits on the side and top walls, and on the bottom of the buried cavity 40 to form a filling layer 52 that coats completely the internal walls of the buried cavity. At the same time, the metallic material coats the walls of the trenches 48, to form an electrical connection with the metallic coating of the buried cavity 40. The process of deposition of metal continues until the trenches 48 are completely filled.

Deposition of the metallic material on the walls of the buried cavity 40 and of the trenches 48 is preferably preceded by a step of deposition of a barrier layer 54, having the function of protecting against diffusion of metallic species of the filling layer 52 within the substrate 2 and the epitaxial layer 6, and of guaranteeing an ohmic contact with the substrate 2. The barrier layer is, for example, of titanium nitride (TiN) or tantalum nitride (TaN) and has a thickness of some tens of nanometers, for example between 10 and 30 nm. Other materials that may be used for the barrier layer 54 include oxides, or else nitrides such as for example TiSiN, TiAlN, TiAlCN, NbN, MoN, $WC_x$, and $WN_x$.

Further, it is likewise possible to envisage, prior to the step of deposition of the barrier layer 54, a step of formation of a contact layer (not illustrated) designed to improve ohmic contact with the substrate 2. For this purpose, it is possible to deposit, using the ALD (atomic-layer deposition) technique, a metallic layer such as for example titanium or cobalt, and carry out a fast thermal process (at approximately 900° C.-1000° C.) up to formation of a layer of titanium silicide ($TiSi_2$) or cobalt silicide ($CoSi_2$). This is followed by formation of the barrier layer 54 and of the filling layer 52.

Finally, polishing techniques may be carried out to planarize the top surface of the wafer (e.g., CMP techniques).

The step described previously for deposition of the filling layer 52 by CVD may be replaced by, or integrated with, a step of deposition using the ALD technique, which may be used for covering more complex geometries, such as for example possible corners of the buried cavity and/or for deposition of metallic materials with high conductivity (aluminum, copper, etc.).

The buried conductive region 20 of FIG. 1 is thus formed.

During the steps described above of deposition of metallic material, also the trench 42 is filled with the same material.

Other metallic materials, or their alloys, may be used for formation of the filling layer 52, such as for example Ru, Pt, Ir, Pd, Rh, Ag, Au, Co, Fe, Ni, Mo, and Ta.

FIGS. 11-16 show steps for manufacturing the integrated semiconductor device 1 of FIG. 1 according to a method alternative to that of FIGS. 2-10.

In this case (FIG. 11), the silicon substrate 2 is provided and, by lithographic and etching steps, a recess 60 is formed having the dimensions and shape desired for the buried conductive region 20 of FIG. 1.

Then (FIG. 12), a step of deposition of silicon germanium (SiGe) is carried out up to complete filling of the recess 60, thus forming a filling layer 62. The silicon germanium deposited outside the recess 60 is removed, for example using the CMP technique.

There then follows (FIG. 13) growth of the epitaxial layer 6 on the substrate 2 and on the filling layer 62. Formed in a known way in the epitaxial layer 6 is the electronic component 8, as described previously with reference to FIG. 7. The field-oxide insulation region 14 and the pre-metal dielectric layer 22 are likewise formed.

Then (FIG. 14), an etching mask 66 is formed similar to the mask 44 described with reference to FIG. 9, i.e., presenting openings 66' that extend aligned, along Z, with respective portions of the filling layer 62. A step of etching the pre-metal dielectric layer 22, of the insulation region 14, and of the epitaxial layer 6 is then carried out to form trenches 68 that reach and expose surface portions of the filling layer 62.

There is then carried out (FIG. 15) a step of selective etching of the filling layer 62, for example via a wet etch, to remove completely the silicon germanium and thus form a buried cavity 70 in fluidic connection with the trenches 68.

Then (FIG. 16), one or more steps of deposition of metallic material are carried out, using the CVD and/or ALD techniques, as described previously, for complete covering of the internal walls of the buried cavity 70 and filling of the trenches 68 by a layer of metallic material (or metallic alloy) 72 so that the metallic layer 72 inside the buried cavity 70 is in electrical connection with the filling layer of the trenches 68 and may thus be electrically biased from outside the integrated semiconductor device 1. A barrier layer, similar to the barrier layer 54 described previously, may advantageously be deposited prior to the metallic layer 72.

From what has been described above, the advantages of the disclosure illustrated in the various embodiments are evident.

In particular, the conductive buried region 20 and the one or more electrical contacts 24 are made of a same metallic material, or alloy of metallic materials, that forms a continuous path. In this way, the electrical resistance is considerably reduced.

Further, the manufacturing process described envisages formation of a buried cavity in a monolithic semiconductor body, without any need to carry out bonding operations. The structural stability is thus improved, and the manufacturing costs are reduced.

Finally, it is evident that modifications and variations may be made to the disclosure described herein, without thereby departing from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing an electronic device, comprising:
   forming a buried cavity in a semiconductor body;
   forming an active region, including an electronic component, in the semiconductor body above the buried cavity;
   forming a dielectric region, surrounding the active region, in the semiconductor body;
   etching selective portions of the semiconductor body and the dielectric region to form one or more openings in fluidic connection with the buried cavity;
   depositing metallic material within the buried cavity through the one or more openings, completely coating internal walls of the buried cavity and forming a metallic buried region, and completely coating internal walls of the one or more openings to form one or more paths for electrical access to the metallic buried region, wherein the semiconductor body includes a substrate and an epitaxial layer formed on the substrate, and forming the buried cavity includes:
   etching selective portions of the substrate and forming a recess;
   filling the recess with silicon germanium to form a sacrificial layer of silicon germanium;
   growing an epitaxial layer on the substrate and on the sacrificial layer; and
   removing completely the sacrificial layer through said one or more openings.

2. The method according to claim 1, wherein the depositing includes depositing the metallic material using CVD and/or ALD technology.

3. The method according to claim 1, further comprising, prior to depositing the metallic material, depositing a barrier layer configured to form a barrier against diffusion of metallic species towards the semiconductor body and to form an ohmic contact with the substrate.

4. The method according to claim 1, wherein coating the internal walls of the buried cavity and of coating the internal walls of the one or more openings are carried out simultaneously.

5. The method according to claim 1, wherein the semiconductor body includes a substrate and an epitaxial layer formed on the substrate, wherein the substrate has a first conductivity, the method further comprising:
   implanting dopant species that have a second conductivity type in the substrate, thereby forming an implanted region; and
   forming the buried cavity inside the implanted region and/or the epitaxial layer so that the metallic buried region is separated from a portion of the substrate by a portion of the implanted region and/or of the epitaxial layer.

6. The method according to claim 1, wherein forming the dielectric region and forming the one or more openings occur after forming the buried cavity in the semiconductor body.

7. A method for manufacturing an electronic device, comprising:
   forming a buried cavity in a semiconductor body;
   forming an active region, including an electronic component, in the semiconductor body above the buried cavity;
   forming a dielectric region, surrounding the active region, in the semiconductor body, after forming the buried cavity;
   etching selective portions of the semiconductor body at the dielectric region after forming the buried cavity, the etching step forming one or more openings in fluidic connection with the buried cavity;
   depositing metallic material within the buried cavity through the one or more openings, completely coating internal walls of the buried cavity and forming a metallic buried region, and completely coating internal walls of the one or more openings to form one or more paths for electrical access to the metallic buried region, wherein the semiconductor body includes a substrate and an epitaxial layer formed on the substrate, and forming the buried cavity includes:
   etching selective portions of the substrate and forming a recess;
   filling the recess with silicon germanium to form a sacrificial layer of silicon germanium;
   growing an epitaxial layer on the substrate and on the sacrificial layer; and
   removing completely the sacrificial layer through, said one or more openings.

8. The method according to claim 7, further comprising, prior to depositing the metallic material, depositing a barrier layer configured to form a barrier against diffusion of metallic species towards the semiconductor body and to form an ohmic contact with the substrate.

9. The method according to claim 7, wherein coating the internal walls of the buried cavity and of coating the internal walls of the one or more openings are carried out simultaneously.

10. The method according to claim 7, wherein the semiconductor body includes a substrate and an epitaxial layer formed on the substrate, wherein the substrate has a first conductivity, the method further comprising:
    implanting dopant species that have a second conductivity type in the substrate, thereby forming an implanted region; and
    forming the buried cavity inside the implanted region and/or the epitaxial layer so that the conductive buried region is separated from a portion of the substrate by a portion of the implanted region and/or of the epitaxial layer.

11. The method according to claim 7, wherein forming the one or more openings includes etching selective portions of the dielectric region.

12. A method for manufacturing an electronic device, comprising:
    etching selective portions of a semiconductor substrate and forming a recess;
    filling the recess with silicon germanium to form a sacrificial layer of silicon germanium;
    growing an epitaxial layer on the substrate and on the sacrificial layer;

forming an electronic component in the epitaxial layer and above the sacrificial layer;

forming a dielectric region surrounding the active region and above the epitaxial layer and sacrificial layer;

etching selective portions of the semiconductor body and the dielectric region, the etching step forming one or more openings in fluidic connection with the buried cavity;

removing completely the sacrificial layer through said one or more openings, forming a buried cavity in the substrate; and depositing metallic material within the buried cavity through the one or more openings, completely coating internal walls of the buried cavity and forming a metallic buried region, and completely coating internal walls of the one or more openings to form one or more paths for electrical access to the conductive buried region.

13. The method according to claim 12, further comprising, prior to depositing the metallic material, depositing a barrier layer configured to form a barrier against diffusion of metallic species towards the semiconductor body and to form an ohmic contact with the substrate.

14. The method according to claim 12, wherein coating the internal walls of the buried cavity and of coating the internal walls of the one or more openings are carried out simultaneously.

* * * * *